United States Patent
Kobayashi

(10) Patent No.: US 9,641,778 B2
(45) Date of Patent: May 2, 2017

(54) IMAGING DEVICE AND METHOD FOR DRIVING THE SAME

(71) Applicant: CANON KABUSHIKI KAISHA, Tokyo (JP)

(72) Inventor: Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 105 days.

(21) Appl. No.: 14/805,302

(22) Filed: Jul. 21, 2015

(65) Prior Publication Data

US 2016/0028986 A1  Jan. 28, 2016

(30) Foreign Application Priority Data

Jul. 24, 2014 (JP) .................................. 2014-151123

(51) Int. Cl.
*H04N 5/3745* (2011.01)
*H01L 27/146* (2006.01)
*H04N 5/355* (2011.01)

(52) U.S. Cl.
CPC ..... *H04N 5/3745* (2013.01); *H01L 27/14616* (2013.01); *H01L 27/14643* (2013.01); *H04N 5/3559* (2013.01)

(58) Field of Classification Search
CPC ................ H04N 5/3559; H04N 5/3745; H01L 27/14609; H01L 27/14643; H01L 27/14645
See application file for complete search history.

(56) References Cited

U.S. PATENT DOCUMENTS

| | | | |
|---|---|---|---|
| 2006/0208291 A1* | 9/2006 | Koizumi | H01L 27/14603 257/292 |
| 2011/0211103 A1* | 9/2011 | Sakano | H04N 5/37452 348/308 |
| 2011/0315854 A1* | 12/2011 | Janesick | G01J 1/46 250/208.1 |
| 2012/0256077 A1* | 10/2012 | Yen | H01L 27/14609 250/208.1 |
| 2014/0103189 A1 | 4/2014 | Chen | |
| 2014/0353472 A1* | 12/2014 | Dierickx | H01L 27/14612 250/214 P |
| 2015/0124132 A1* | 5/2015 | Mabuchi | H01L 27/14609 348/296 |

FOREIGN PATENT DOCUMENTS

| | | |
|---|---|---|
| EP | 1887626 A1 | 2/2008 |
| JP | 2008-205639 A | 9/2008 |
| WO | 2012042782 A1 | 4/2012 |

* cited by examiner

*Primary Examiner* — Paul Berardesca

(74) *Attorney, Agent, or Firm* — Canon USA, Inc. IP Division

(57) ABSTRACT

An imaging device according to an embodiment of the present invention includes a plurality of pixels. Each of the pixels has an active region including a first region and a second region with an electrode therebetween in plan view. A portion that is a portion of the active region and that is located under the electrode forms at least a portion of a capacitor. The first region includes a first semiconductor region of a first conductivity type that forms at least a portion of a floating diffusion, and the second region includes a second semiconductor region of a second conductivity type opposite to the first conductivity type. An insulating film is disposed on the second semiconductor region.

13 Claims, 12 Drawing Sheets

IMAGING DEVICE AND METHOD FOR DRIVING THE SAME

BACKGROUND OF THE INVENTION

Field of the Invention

The present invention relates to an imaging device and a method for driving the same, and more specifically to a structure of a capacitor capable of varying a capacitance value of an input node of an amplifier transistor in a pixel.

Description of the Related Art

In the art, it is common to employ a capacitor to expand the dynamic range of a signal to be output from a pixel. The capacitor is disposed so that the electrical connection of the capacitor to a floating diffusion (FD) can be switched.

Japanese Patent Laid-Open No. 2008-205639 describes a configuration in which an FD is disposed in a first region and a semiconductor region of the same conductivity type as that of signal charge is disposed in a second region in such a manner that a gate electrode configured to switch the electrical connection of a capacitor to the FD is placed between the first region and the second region.

SUMMARY OF THE INVENTION

An imaging device according to an aspect of the present invention includes a plurality of pixels. Each of the plurality of pixels includes a photoelectric conversion unit, a floating diffusion configured to hold charge generated in the photoelectric conversion unit, an amplifier transistor electrically connected to the floating diffusion, and a capacitor including an electrode. The capacitor is disposed so that electrical connection of the capacitor to the floating diffusion is switchable in accordance with a signal supplied to the electrode. The electrical connection of the capacitor to the floating diffusion is switched to vary a capacitance value of an input node of the amplifier transistor. Each of the plurality of pixels has an active region including a first region and a second region, and the first region and the second region are arranged with the electrode therebetween in plan view. A portion that is a portion of the active region and that is located under the electrode forms at least a portion of the capacitor. The first region includes a first semiconductor region of a first conductivity type, the first semiconductor region forming at least a portion of the floating diffusion. The second region includes a second semiconductor region of a second conductivity type opposite to the first conductivity type. An insulating film is disposed on the second semiconductor region.

Further features of the present invention will become apparent from the following description of exemplary embodiments with reference to the attached drawings.

DESCRIPTION OF THE EMBODIMENTS

Figure 1:
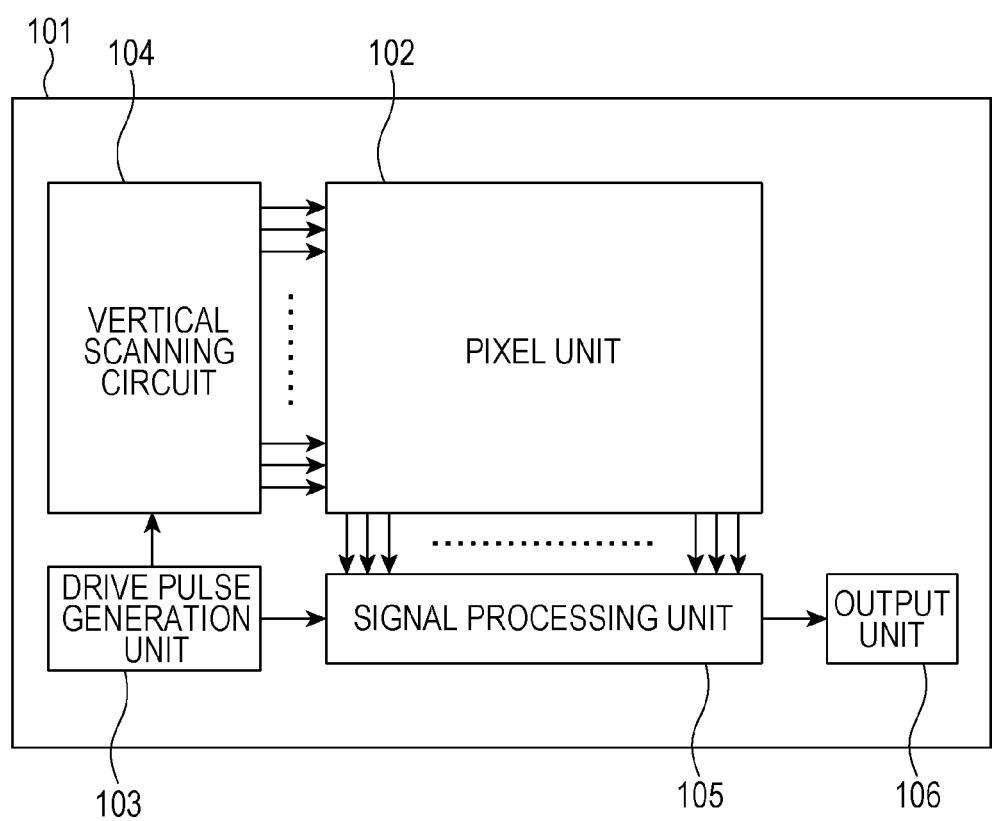
FIG. 1 is a block diagram of an imaging device.

An imaging device according to an embodiment of the present invention will be described with reference to FIGS. 1 to 5B. In the drawings, the same numerals represent the same or substantially the same elements or the same or substantially the same regions.

FIG. 1 is a block diagram of an imaging device 101 according to an embodiment of the present invention. The imaging device 101 includes a pixel unit 102, a drive pulse generation unit 103, a vertical scanning circuit 104, a signal processing unit 105, and an output unit 106.

The pixel unit 102 includes a plurality of pixels in a matrix. Each of the pixels converts light into an electric signal, and outputs the resulting electric signal. The drive pulse generation unit 103 generates a drive pulse. The vertical scanning circuit 104 receives a drive pulse from the drive pulse generation unit 103, and supplies a control signal to each pixel. The signal processing unit 105 serializes at least signals output in parallel from a plurality of pixel columns, and transmits the resulting signals to the output unit 106. The signal processing unit 105 may include column circuits, each of which corresponds to one pixel column and performs operations such as signal amplification and analog-to-digital (AD) conversion.

Figure 2:
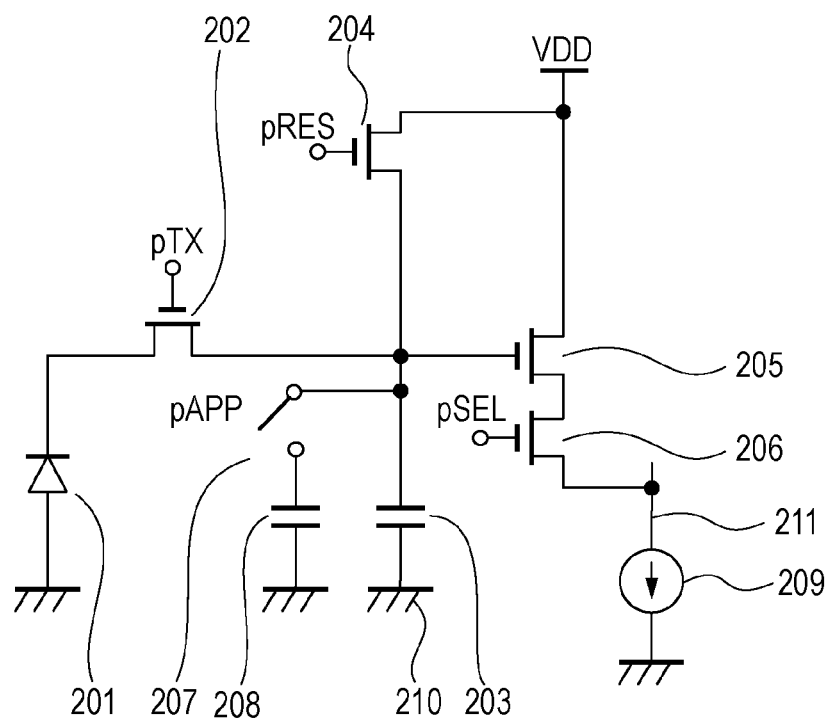
FIG. 2 is a circuit diagram of a pixel.

FIG. 2 illustrates an example of an equivalent circuit of each of the pixels in the pixel unit 102 according to this embodiment. In this embodiment, a description will be made in the context that signal charge is carried by electrons and each transistor is an n-type metal oxide semiconductor (MOS) transistor. In this embodiment, a first conductivity type is n-type, and a second conductivity type is p-type, which is a conductivity type opposite to the first conductivity type. Note that signal charge may be carried by holes and each transistor may be a p-type MOS transistor.

Further, the equivalent circuit is not limited to that illustrated in FIG. 2, and part of the configuration may be shared by a plurality of pixels. An embodiment of the present invention is applicable to either a front-side illuminated imaging device in which light enters from a front side of the imaging device or a back-side illuminated imaging device in which light enters from a back side of the imaging device.

Each of the pixels according to this embodiment includes a capacitor 208 configured to be capable of varying the capacitance value of an input node of an amplifier transistor 205. The input node of the amplifier transistor 205 includes at least an FD 203, a gate electrode of the amplifier transistor 205, and a conductor that electrically connects the FD 203 and the gate electrode of the amplifier transistor 205.

A changeover switch 207 enables switching of an electrically connected state and an unconnected state between the capacitor 208 and the FD 203. The capacitor 208, when electrically connected to the FD 203 via the changeover switch 207, forms a portion of the input node of the amplifier transistor 205.

Bringing the capacitor 208 and the FD 203 into an electrically connected state to increase the capacitance value of the input node of the amplifier transistor 205 enables a reduction in charge-voltage conversion efficiency at the input node of the amplifier transistor 205, compared with the case of bringing the capacitor 208 and the FD 203 into the unconnected state. In contrast, bringing the capacitor 208 and the FD 203 into the unconnected state to reduce the capacitance value of the input node of the amplifier transistor 205 enables an improvement in charge-voltage conversion efficiency at the input node of the amplifier transistor 205.

Relatively low charge-voltage conversion efficiency reduces the amplitude of the voltage obtained as a result of charge-voltage conversion at the input node of the amplifier transistor 205. This enables an improvement in the linearity of an output signal of the amplifier transistor 205 even if a large quantity of charge has been transferred to the FD 203.

In contrast, relatively high charge-voltage conversion efficiency increases the amplitude of the voltage obtained as a result of charge-voltage conversion at the input node of the amplifier transistor 205. This enables an improvement in the linearity of an output signal of the amplifier transistor 205 even if a small quantity of charge has been transferred to the FD 203.

Accordingly, the electrically connected state and the unconnected state between the FD 203 and the capacitor 208 are switched to make the dynamic range variable.

Each of the pixels according to this embodiment will now be described in detail with reference to FIG. 2.

A photoelectric conversion unit 201 performs photoelectric conversion to generate charge pairs, the quantity of which corresponds to the amount of incident light, and accumulates electrons. A transfer transistor 202 transfers the electrons accumulated in the photoelectric conversion unit 201 to the FD 203. A control signal pTX is supplied to a gate electrode of the transfer transistor 202. The FD 203 holds the signal charges transferred by the transfer transistor 202.

The amplifier transistor 205 has a gate electrode electrically connected to the FD 203, and is configured to amplify a signal based on the electrons transferred to the FD 203 by the transfer transistor 202 and to output the amplified signal. More specifically, the electrons transferred to the FD 203 are converted into a voltage according to the quantity thereof, and an electric signal corresponding to the voltage is output to outside the pixel via the amplifier transistor 205. The amplifier transistor 205 and a current source 209 form a source follower circuit.

A reset transistor 204 resets the potential of the input node of the amplifier transistor 205. The reset transistor 204 can also reset the potential of the photoelectric conversion unit 201 through the overlap of the turn-on period of the reset transistor 204 and the turn-on period of the transfer transistor 202. A control signal pRES is supplied to a gate electrode of the reset transistor 204.

A selection transistor 206 allows signals of a plurality of pixels provided for each signal line 211 to be output pixel by pixel or in groups of a plurality of pixels. The selection transistor 206 has a drain electrically connected to a source of the amplifier transistor 205, and a source electrically connected to the signal line 211. Instead of the configuration according to this embodiment, the selection transistor 206 may be disposed in an electrical path between a drain of the amplifier transistor 205 and a power supply line to which a power supply voltage is supplied.

That is, it may be sufficient that the selection transistor 206 is configured to be capable of controlling an electrical conduction between the amplifier transistor 205 and the signal line 211. A control signal pSEL is supplied to a gate electrode of the selection transistor 206.

The selection transistor 206 may not necessarily be used to connect the source of the amplifier transistor 205 to the signal line 211. In this case, selection and non-selection of the pixel are switched by switching the potential of the drain or gate electrode of the amplifier transistor 205.

Figure 3:
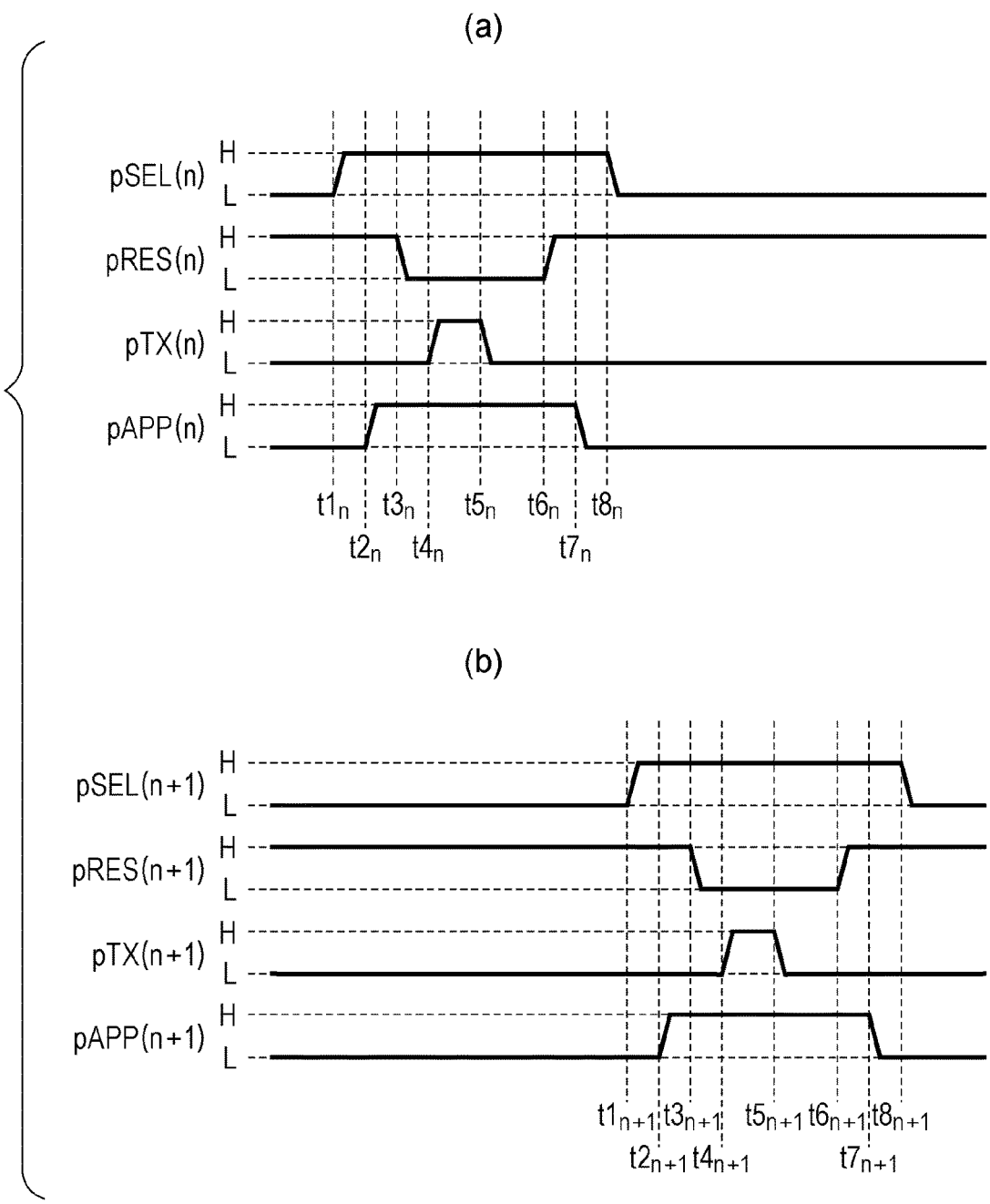
FIG. 3 is a driving timing diagram.

FIG. 3 illustrates an example of the drive pulses, illustrated in FIG. 2, for the imaging device 101. Referring to FIG. 3, only the driving timing directly related to the features of this embodiment is described. Part (a) of FIG. 3 illustrates the driving timing of the n-th row. Part (b) of FIG. 3 illustrates the driving timing of the (n+1)-th row.

In FIG. 3, solid lines indicate control signals for a pixel in which the capacitor 208 and the FD 203 are in a connected state or control signals in a mode in which the capacitor 208 is in connection to the FD 203.

In FIG. 3, dotted lines indicate control signals for a pixel in which the capacitor 208 and the FD 203 are in an unconnected state or control signals in a mode in which the capacitor 208 is not in connection to the FD 203. In a period during which each control signal is at a high level (hereinafter, "H level"), the corresponding transistor is turned on; in a period during which each control signal is at a low level (hereinafter, "L level"), the corresponding transistor is turned off.

In FIG. 3, pSEL denotes a control signal input to the gate of the selection transistor 206. For a selected row, the control signal pSEL is at the H level in the period from time t1 to time t8. For a non-selected row, as indicated by the dotted line, the control signal pSEL is at the L level in the period from time t1 to time t8.

pRES denotes a control signal input to the gate of the reset transistor 204. While the control signal pRES is at the H level, the potential of the FD 203 is reset.

pTX denotes a control signal input to the gate of the transfer transistor 202. While the control signal pTX is at the H level, the photoelectric conversion unit 201 and the FD 203 are in the connected state. While the control signal pTX is at the L level, the photoelectric conversion unit 201 and the FD 203 are in the unconnected state.

pAPP denotes a control signal input to the changeover switch 207. The control signal pAPP causes switching of the connection state between the capacitor 208 and the FD 203. While the control signal pAPP is at the H level, the capacitor 208 and the FD 203 are in the connected state. While the control signal pAPP is at the L level, the capacitor 208 and the FD 203 are in the unconnected state.

First, at time $t1_n$, the control signal pSEL starts to transition from the L level, and rises to the H level after a certain time period has elapsed. During this period, the control signal pRES is at the H level. Then, the potential of the FD 203 becomes equal to VDD.

Then, at time $t2_n$, the control signal pAPP starts to transition from the L level, and rises to the H level after a certain time period has elapsed. During this period, the control signal pSEL and the control signal pRES are at the H level. Accordingly, the capacitor 208 and the FD 203 are brought into an electrically connected state. Then, the potentials of the FD 203 and the capacitor 208 become equal to VDD. In order to keep the capacitor 208 and the FD 203 in the unconnected state, the control signal pAPP(n) is maintained at the L level.

Then, at time $t3_n$, the control signal pRES starts to transition from the H level, and falls to the L level after a certain time period has elapsed. Then, the operation of resetting the potentials of the FD 203 and the capacitor 208 is completed.

At time $t4_n$, the control signal pTX starts to transition from the L level, and rises to the H level after a certain time period has elapsed. At this time, the photoelectric conversion unit 201 and the FD 203 are brought into an electrically connected state. Then, the electrons in the photoelectric conversion unit 201 are transferred to the FD 203. The control signal pAPP is at the H level, during which the capacitor 208 and the FD 203 are in the connected state. Thus, the transferred electrons are held in the FD 203 and the capacitor 208.

At time $t5_n$, the control signal pTX starts to transition from the H level, and falls to the L level after a certain time period has elapsed. Accordingly, the photoelectric conversion unit 201 and the FD 203 are brought into the unconnected state.

At time $t6_n$, the control signal pRES starts to transition from the L level, and rises to the H level after a certain time period has elapsed. Accordingly, the potentials of the FD 203 and the capacitor 208 become equal to VDD.

At time $t7_n$, the control signal pAPP starts to transition from the H level, and falls to the L level after a certain time period has elapsed. Accordingly, the capacitor 208 and the FD 203 are brought into the unconnected state.

At time $t8_n$, the control signal pSEL starts to transition from the H level, and falls to the L level after a certain time period has elapsed. Accordingly, readout for the n-th row is completed. A similar operation is repeatedly performed for the (n+1)-th row (part (b) of FIG. 3) and the following rows, and signals are read out from the pixel unit 102.

Using the voltage on the signal line 211 during the period from time $t5_n$ to time $t8_n$ as a signal enables a signal of a pixel in which the capacitor 208 is connected to be used as an image signal.

In addition, using the voltage on the signal line 211 during the period from time $t3_n$ to time $t4_n$ as a signal, if necessary, enables a noise signal of a pixel to be obtained. Taking a difference between the noise signal and the signal charge described above can reduce noise.

The control signal pSEL is maintained at the H level in the period from time $t1_n$ to time $t8_n$. Alternatively, the control signal pSEL may be set to the H level only within a period during which a signal held in the input node of the amplifier transistor 205 while the capacitor 208 and the FD 203 are in the connected state is read out to the signal processing unit 105.

The electrically connected state and the unconnected state between the FD 203 and the capacitor 208 may be switched by batch for all the pixels, or may be switched pixel by pixel or in groups of a predetermined number of pixels. For example, the electrically connected state and the unconnected state of the capacitor 208 may be switched from one to the other for each color of a color filter.

A transition of a pulse from the H (or L) level to the L (or H) level requires a certain time period. A time period may be intentionally provided for a pulse to reach a target level. In FIG. 3, the time period taken for a pulse to reach from a certain level to a target level is expressed as a certain time period, regardless of whether it is a time period intentionally provided for a pulse to reach a target level or an inherent time period.

Next, the features of the pixels according to this embodiment will be described. FIGS. 4A and 4B and FIGS. 5A and 5B illustrate schematic plan views and schematic cross-sectional views of each of the pixels in the imaging device 101 according to this embodiment to illustrate the features of the pixel.

Figure 4A:
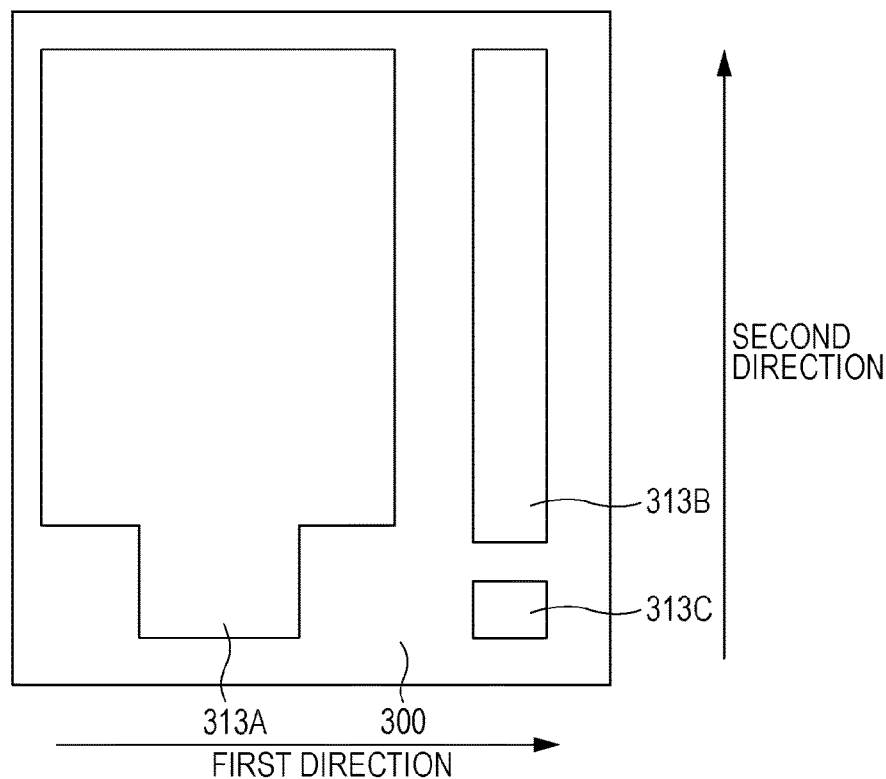
FIGS. 4A and 4B are schematic plan views of a pixel.
Figure 4B:
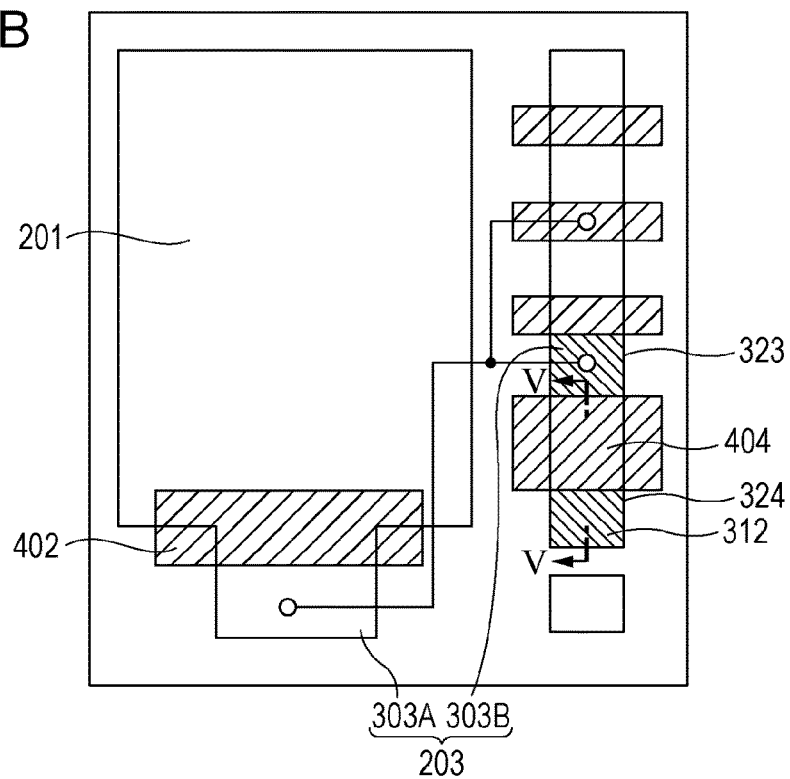

FIG. 4A illustrates an insulator isolation portion 300 and active regions (313A to 313C) defined by the insulator isolation portion 300, for ease of illustration of the active regions. As illustrated in FIG. 4B, each pixel includes semiconductor regions in the active regions illustrated in FIG. 4A, and gate electrodes in the active regions. In FIG. 4B, the signs (313A to 313C) assigned to the active regions in FIG. 4A are omitted.

Figure 5A:
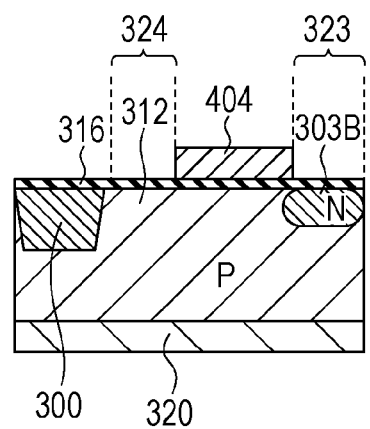
FIGS. 5A and 5B are schematic cross-sectional views of the pixel, taken along the line V-V in FIG. 4.
Figure 5B:
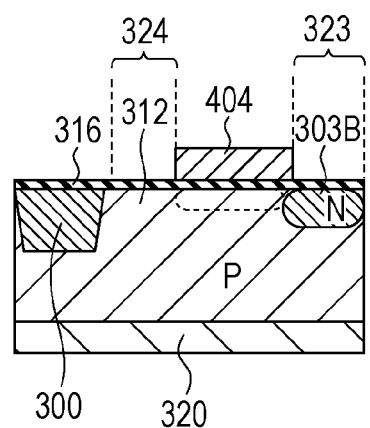

FIG. 5A and FIG. 5B are schematic cross-sectional views taken along the line V-V in FIG. 4B, and illustrate an example configuration of the capacitor 208.

FIG. 4A and FIG. 4B are diagrams of each pixel as viewed in plan. As may be seen from the schematic cross-sectional views described below, such as FIG. 5A, the insulator isolation portion 300 is disposed on the front side of a semiconductor substrate 320, and the active regions are defined by the insulator isolation portion 300. In other words, each active region is surrounded by the insulator isolation portion 300.

In this embodiment, the insulator isolation portion 300 that defines the active regions is disposed by way of example. A PN junction isolation portion may be disposed instead of the insulator isolation portion 300.

In the embodiment described here, the active regions include active regions 313A (a first active region), 313B (a second active region), and 313C (a third active region) defined by the insulator isolation portion 300. The first active region 313A and the second active region 313B are disposed side-by-side in a first direction.

The second active region 313B has a shape that is longer in a second direction (typically a direction perpendicular to the first direction) perpendicular to the first direction than in the first direction in plan view. The second active region 313B and the third active region 313C are disposed side-by-side in the second direction. In this embodiment, the third active region 313C is used as a region to which a reference potential is supplied. The third active region 313C may not necessarily be used.

The surfaces of the active regions (313A, 313B, and 313C) are covered with an insulating film 316. Thus, an electrode 404 and a gate electrode (hereinafter referred to as "the electrode and the like") are disposed on top of the respective active regions with a portion of the insulating film 316 interposed therebetween. The insulating film 316 is composed of, for example, silicon oxide. If the insulating film 316 is deposited using a chemical vapor deposition (CVD) technique, the insulating film 316 is also formed on the surface of the insulator isolation portion 300. If the insulating film 316 is formed using a thermal oxidation method, in contrast, the insulating film 316 is not substantially formed on the surface of the insulator isolation portion 300. In a case where the active regions are defined by a PN junction isolation portion, the insulating film 316 is formed on top of the PN junction isolation portion regardless of which method is used to form the insulating film 316.

Further, an active region that is not located under the electrode and the like may be configured such that an insulating film different from an insulating film that is located under the electrode and the like is formed on at least a portion of the surface of the active region. The different insulating film is, for example, another insulating film that is formed after an insulating film located under the electrode and the like has been formed and a portion of the insulating film located not under the electrode and the like has been removed.

In the following, a description will be given of the case where an insulating film located under the electrode and the like and an insulating film located not under the electrode and the like, which are disposed on the surfaces of the active regions, are the same.

As illustrated in FIG. 4B, the photoelectric conversion unit 201, a gate electrode 402, and an n-type semiconductor region (third semiconductor region) 303A are disposed in the first active region 313A so as to be arranged in the second direction. The gate electrode 402 is disposed in the first active region 313A with the insulating film 316 interposed between the gate electrode 402 and the first active region 313A. The electrode 404 is disposed in the second active region 313B with the insulating film 316 interposed between the electrode 404 and the second active region 313B.

As illustrated in FIG. 4B, furthermore, the second active region 313B has a first region 323 and a second region 324 such that the electrode 404 is located between the first region 323 and the second region 324 in plan view.

The first region 323 includes an n-type semiconductor region (first semiconductor region) 303B. The first semiconductor region 303B forms at least a portion of the FD 203.

The second region 324 includes a p-type semiconductor region (second semiconductor region) 312. The second semiconductor region 312 forms an interface with the insulating film 316.

The FD 203 includes the first semiconductor region 303B, and the third semiconductor region 303A located in the first active region 313A.

FIG. 5A is a schematic cross-sectional view taken along the line V-V in FIG. 4B. In FIG. 5A, the first region 323 and the second region 324 are arranged with the electrode 404 therebetween. The n-type semiconductor region 303B is located in the first region 323. The p-type semiconductor region 312, which forms an interface with the insulating film 316, is located in the second region 324. In the example illustrated in FIG. 5A, a surface-type MOS capacitor is formed in a semiconductor region under the electrode 404. The surface-type MOS capacitor serves as a charge accumulation region formed by the inversion of the p-type semiconductor region 312 disposed on the surface of the active region under the electrode 404 due to an electric field applied via the insulating film 316. Accordingly, the capacitor 208 illustrated in FIG. 2 is formed. Other embodiments are described below using examples.

The electrode 404 is included in the changeover switch 207 illustrated in FIG. 2. A control signal pAPP applied to the electrode 404 enables switching of the electrical connection of the capacitor 208 to the FD 203 described below between an electrically connected state and an unconnected state.

In the capacitor 208, a potential well is formed in a surface of the active region under the electrode 404, and electrons are accumulated in the potential well. Entry of electrons in the potential well from the surface of the second region 324 described above may cause noise in the FD 203 when the capacitor 208 is in connection with the FD 203.

The p-type semiconductor region 312 having the insulating film 316 disposed thereon is located in the second region 324, allowing electrons, which may cause noise as described above, to be recombined with holes that are majority carriers in the p-type semiconductor region 312. Accordingly, the quantity of electrons that enter the n-type semiconductor region 303B can be reduced, resulting in a reduction in noise. In one embodiment, the p-type semiconductor region 312 forms an interface with the insulating film 316.

Further, a defect at an interface between an active region and the insulator isolation portion 300 due to the difference in coefficient of expansion between the insulator isolation portion 300, which is mainly composed of silicon oxide, and the semiconductor substrate 320, which is mainly composed of silicon, may cause unwanted charge.

Therefore the p-type semiconductor region 312 may be located in the second region 324 at least up to a depth equal to that of the bottom of the insulator isolation portion 300 from the interface between the active region and the insulating film 316. This enables the capacitor 208 and the insulator isolation portion 300 to be offset, and can reduce noise caused from the insulator isolation portion 300.

In this embodiment, the description has been made using a surface-type MOS capacitor. As illustrated in FIG. 5B, a buried-type MOS capacitor in which an n-type semiconductor region is disposed on a surface of the active region under the electrode 404 may be used.

In this embodiment, furthermore, the p-type semiconductor region 312 in which a P-well is formed as a p-type semiconductor region is disposed in the second region 324, by way of example. The depth of the p-type semiconductor region in the second region 324 is not particularly limited. A region in the second region 324 other than the region that forms an interface with the insulating film 316 may be an n-type semiconductor region. That is, an n-type semiconductor region may be disposed below a p-type semiconductor region formed in the second region 324.

In this embodiment, furthermore, the description has been made assuming that the insulating film 316 disposed on top of the p-type semiconductor region 312 and the insulating film 316 located under the electrode 404 are identical. Alternatively, for example, like an interlayer insulating film, an insulating film different from the insulating film 316 located under the electrode 404 may be disposed on top of the p-type semiconductor region 312.

In this embodiment, furthermore, the active region 313A where the photoelectric conversion unit 201 is located and the active region 313B where the capacitor 208 is located are separate active regions. The active regions 313A and 313B may not necessarily be separate active regions, and may be the same active region.

Specific examples of the imaging device described in this embodiment will now be described.

FIRST EXAMPLE

Figure 6A:
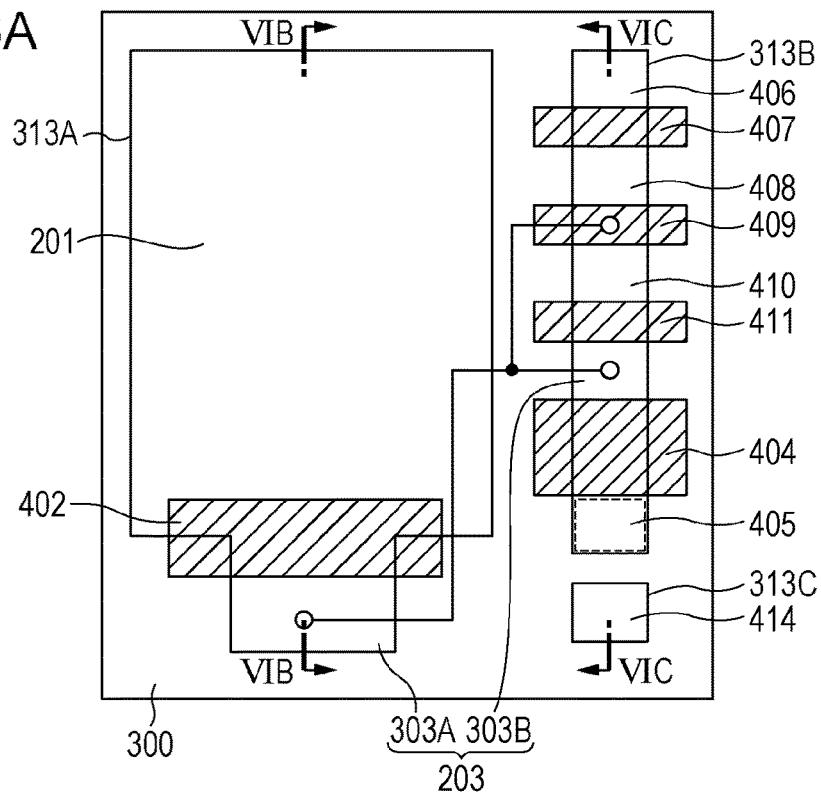
FIG. 6A is a schematic plan view of a pixel according to a first example.
Figure 6B:
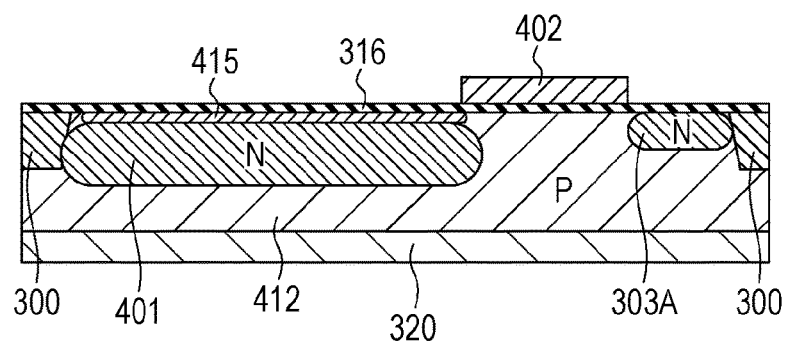
FIGS. 6B and 6C are schematic cross-sectional views of the pixel illustrated in FIG. 6A.
Figure 6C:
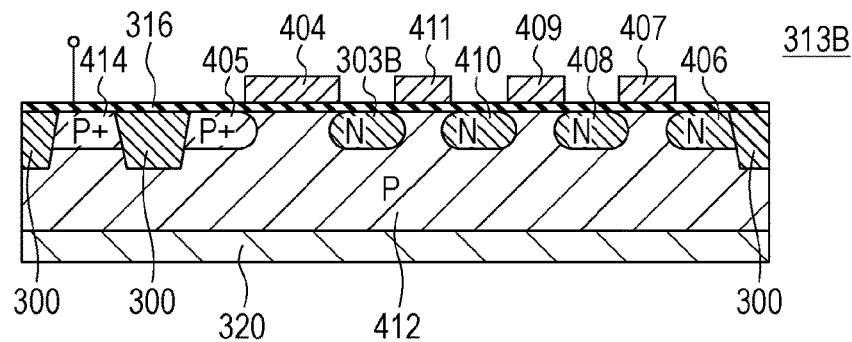

FIG. 6A illustrates a schematic plan view of each pixel of an imaging device according to this example, and FIGS. 6B and 6C illustrate schematic cross-sectional views of the pixel illustrated in FIG. 6A. Portions having functions similar to those in FIGS. 1 to 5B are assigned the same numerals, and are not described in detail. In this example, a p-type semiconductor region 405 corresponds to the second semiconductor region. The p-type semiconductor region 405 is located in a p-type semiconductor region 412 that forms a p-type well.

FIG. 6A is a schematic plan view of each pixel of the imaging device according to this example. Similarly to the active regions (313A, 313B, and 313C) according to the embodiment illustrated in FIG. 4A, active regions according to this example are defined by the insulator isolation portion 300.

In this example, furthermore, as in the configuration according to the embodiment illustrated in FIG. 4B, the second active region 313B includes the first region 323 and the second region 324 which are arranged with the electrode 404 therebetween in plan view. The n-type semiconductor region 303B is located in the first region 323, and the p-type semiconductor region 405 is located in the second region 324. The p-type semiconductor region 405 has a higher impurity concentration than the p-type semiconductor region 412 located below the p-type semiconductor region 405.

The active region 313A includes the photoelectric conversion unit 201, the gate electrode 402, and the n-type semiconductor region 303A such that the photoelectric conversion unit 201, the gate electrode 402, and the n-type semiconductor region 303A are arranged in a second direction perpendicular to a first direction. The active region 313B includes an n-type semiconductor region 406, a gate electrode 407, an n-type semiconductor region 408, a gate electrode 409, an n-type semiconductor region 410, a gate electrode 411, the n-type semiconductor region 303B, the electrode 404, and the p-type semiconductor region 405 such that the n-type semiconductor region 406, the gate electrode 407, the n-type semiconductor region 408, the gate electrode 409, the n-type semiconductor region 410, the gate electrode 411, the n-type semiconductor region 303B, the electrode 404, and the p-type semiconductor region 405 are arranged in the second direction.

The n-type semiconductor region 303A located in the active region 313A is connected to the n-type semiconductor region 303B located in the active region 313B, the capacitor 208 electrically connected to the n-type semiconductor region 303B, and the gate electrode 409 via a conductor. The FD 203 includes the n-type semiconductor regions 303A and 303B.

FIG. 6B is a schematic cross-sectional view taken along the line VIB-VIB in FIG. 6A. FIG. 6C is a schematic cross-sectional view taken along the line VIC-VIC in FIG. 6A. A description will be first given with reference to FIG. 6B.

The photoelectric conversion unit 201 has a PN junction formed by an n-type semiconductor region 401 and the p-type semiconductor region 412. In this example, the photoelectric conversion unit 201 is a photodiode. Further, a p-type semiconductor region 415 is formed on a surface of the n-type semiconductor region 401, thereby achieving a buried-type photodiode. The n-type semiconductor region 401 is located at a position deeper than the positions of semiconductor regions that form the sources and drains of the transistors from the insulating film 316.

The transfer transistor 202 illustrated in FIG. 2 includes the n-type semiconductor region 401, which serves as a drain region of the transfer transistor 202, the gate electrode 402, and the n-type semiconductor region 303A, which serves as a source region of the transfer transistor 202.

The active region 313B illustrated in FIG. 6C will now be described.

The reset transistor 204 illustrated in FIG. 2 includes the n-type semiconductor region 303B, which serves as a source region of the reset transistor 204, the gate electrode 411, and the n-type semiconductor region 410, which serves as a drain region of the reset transistor 204. The amplifier transistor 205 illustrated in FIG. 2 includes the n-type semiconductor region 410, which serves as a drain region of the amplifier transistor 205, the gate electrode 409, and the n-type semiconductor region 408, which serves as a source region of the amplifier transistor 205. The selection transistor 206 illustrated in FIG. 2 includes the n-type semiconductor region 408, which serves as a drain region of the selection transistor 206, the gate electrode 407, and the n-type semiconductor region 406, which serves as a source region of the selection transistor 206.

The third active region 313C includes a p-type semiconductor region 414. A contact plug is connected to the p-type semiconductor region 414 to supply a predetermined voltage to the p-type semiconductor region 412, which forms a well. This configuration can suppress or reduce a change in the potential of the p-type semiconductor region 412. The predetermined voltage is, for example, a ground potential.

The changeover switch 207 illustrated in FIG. 2 includes the electrode 404, and a voltage supplied to the electrode 404 provides switching of the electrical connection of the capacitor 208 to the FD 203 between the electrically connected state and the unconnected state.

In this example, the second region 324 includes the p-type semiconductor region 405, which forms an interface with the insulating film 316.

Further, the p-type semiconductor region 412 is located in the second region 324 below the p-type semiconductor region 405 at least up to a depth equal to that of the bottom of the insulator isolation portion 300. The p-type semiconductor region 412 may be formed by a P-well. The p-type semiconductor region 412 may be located above an N-well.

The term "bottom of the insulator isolation portion 300", as used herein, refers to the position having a depth at which the insulator isolation portion 300 forms an interface with the p-type semiconductor region 412, the position being the deepest.

As described above, the p-type semiconductor region 405 has a higher impurity concentration than the p-type semiconductor region 412. With the configuration described above, a portion that is in close proximity to the capacitor 208 (i.e., a portion near the surface of the second region 324) has a higher p-type impurity concentration than that in the configuration illustrated in FIG. 5A or FIG. 5B. Thus, noise caused by a crystal defect on a surface of a semiconductor region can be reduced, compared with the case where the p-type semiconductor region 412 forms an interface with the insulating film 316 without using the p-type semiconductor region 405.

The p-type semiconductor region 405 may be formed by, for example, using the electrode 404 as a mask and implanting ions into a region that is part of the p-type semiconductor region 412, which is provided in advance.

As described above, this example can reduce noise caused by a crystal defect on an interface with the insulating film 316, and can reduce noise caused from the insulator isolation portion 300.

SECOND EXAMPLE

Figure 7A:
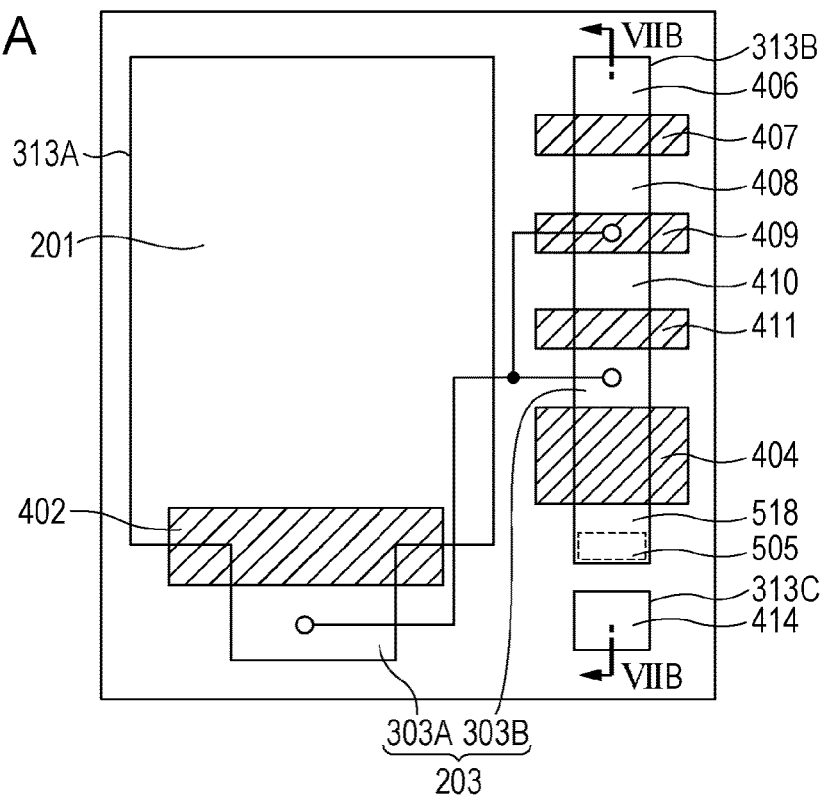
FIG. 7A is a schematic plan view of a pixel according to a second example.
Figure 7B:
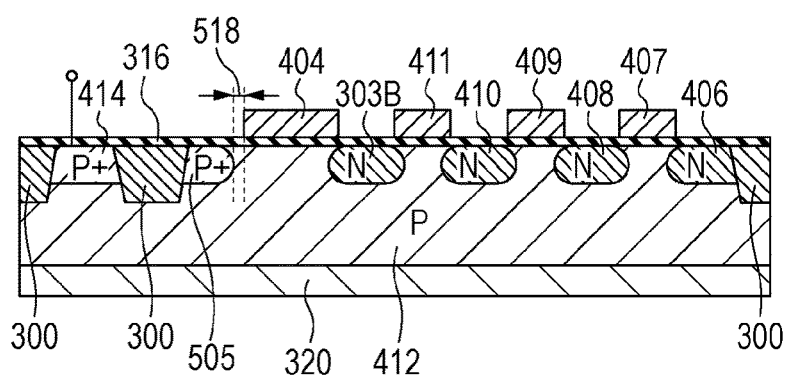
FIG. 7B is a schematic cross-sectional view of the pixel illustrated in FIG. 7A.

FIGS. 7A and 7B are a schematic plan view and a schematic cross-sectional view of each pixel of an imaging device according to this example, respectively, to illustrate the features of the pixel. Portions having functions similar to those in FIGS. 1 to 6C are assigned the same numerals, and are not described in detail.

FIG. 7A is a schematic plan view of each pixel of the imaging device according to this example. In this example, the p-type semiconductor region 412 is formed in the second region 324 in plan view, and a p-type semiconductor region 505 is disposed on a surface of the p-type semiconductor region 412 so as to be offset from the electrode 404. Unlike the first example, given that a region by which the p-type semiconductor region 505 is offset from the electrode 404 is represented by an offset region 518, the p-type semiconductor region 505 is disposed with the offset region 518 placed between the p-type semiconductor region 505 and the electrode 404.

In this example, the offset region 518 and the p-type semiconductor region 505 are located in the second region 324.

FIG. 7B is a schematic cross-sectional view taken along the line VIIB-VIIB in FIG. 7A. The offset region 518 is formed by the p-type semiconductor region 412 having a lower impurity concentration than the p-type semiconductor region 505.

The reason that the offset region 518 is provided will be described with reference to FIG. 3.

In FIG. 3, the control signal pAPP is at the high level in the period from time t2$_n$ to time t7$_n$. Thus, the potential of the electrode 404 of the changeover switch 207 has a high level.

In contrast, the potential of the p-type semiconductor region 412 is configured to have a ground level. Thus, the p-type semiconductor region 505 also has a potential near the ground level. Accordingly, a high electric field is generated between the electrode 404 of the changeover switch 207 and the p-type semiconductor region 505. In actuality, however, a surface-type MOS capacitor may be formed by, for example, the inversion of the p-type semiconductor region 412 located under the electrode 404, and not the entire p-type semiconductor region 412 may have the same ground potential.

In this case, the existence of charge which causes noise in a region to which the high electric field is applied may cause a phenomenon called hot carrier amplification. The hot carrier amplification causes charge to enter the n-type semiconductor region 303B, which results in noise. In order to suppress or reduce the hot carrier amplification, in one embodiment, an electric field between the electrode 404 of the changeover switch 207 and the p-type semiconductor region 505 may be relieved.

Accordingly, in this example, the p-type semiconductor region 412 (i.e., the offset region 518) having a lower impurity concentration than the p-type semiconductor region 505 is provided between the electrode 404 and the p-type semiconductor region 505. This configuration allows the expansion of a larger depletion layer between the electrode 404 and the p-type semiconductor region 505 than that in the case where the p-type semiconductor region 412 (i.e., the offset region 518) is not provided between the electrode 404 and the p-type semiconductor region 505. Thus, an electric field between the electrode 404 and the p-type semiconductor region 505 can be relieved.

The p-type semiconductor region 505 may be formed with the offset region 518 placed between the p-type semiconductor region 505 and the electrode 404 by, for example, using a side spacer composed of an insulator on a sidewall of the electrode 404. Specifically, the side spacer is used as a mask, and ions are implanted into the p-type semiconductor region 412, which is provided in advance. Thus, the p-type semiconductor region 505 can be disposed with the p-type semiconductor region 412 between the p-type semiconductor region 505 and the electrode 404.

Accordingly, this example can suppress or reduce the occurrence of hot carrier amplification, and can further reduce noise.

THIRD EXAMPLE

Figure 8A:
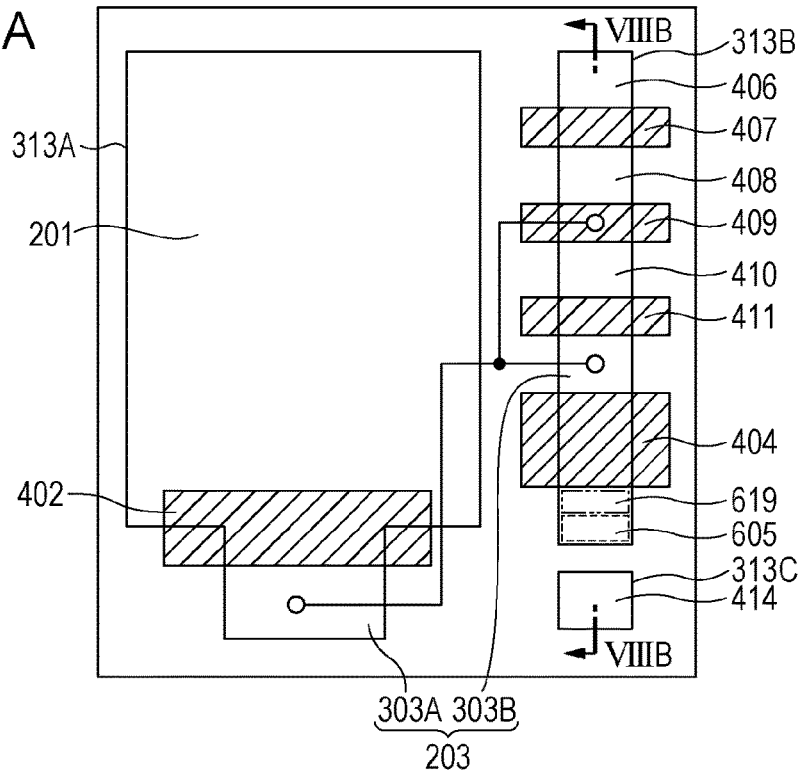
FIG. 8A is a schematic plan view of a pixel according to a third example.
Figure 8B:
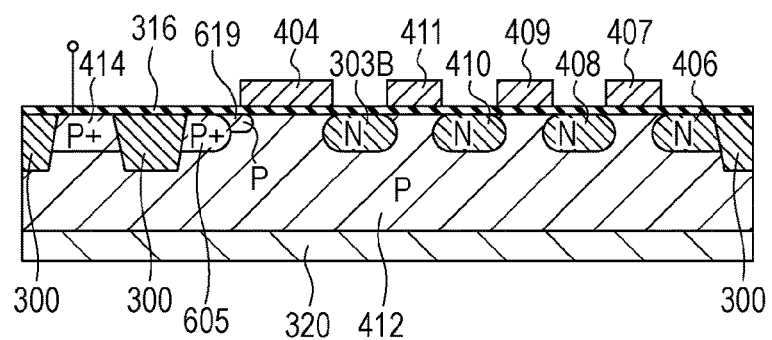
FIG. 8B is a schematic cross-sectional view of the pixel illustrated in FIG. 8A.

FIGS. 8A and 8B are a schematic plan view and a schematic cross-sectional view of each pixel of an imaging device according to this example, respectively, to illustrate the features of the pixel. Portions having functions similar to those in FIGS. 1 to 7B are assigned the same numerals, and are not described in detail.

FIG. 8A is a schematic plan view of each pixel of the imaging device according to this example. In this example, unlike the second example, a p-type semiconductor region 619 is disposed in place of the offset region 518 according to the second example. That is, in this example, unlike the second example, the second region 324 includes the p-type semiconductor region 619, which has a higher impurity concentration than the p-type semiconductor region 412, between a p-type semiconductor region 605 and the electrode 404 in plan view.

FIG. 8B is a schematic cross-sectional view taken along the line VIIIB-VIIIB in FIG. 8A.

The p-type semiconductor region 619 is a region having a higher impurity concentration than the p-type semiconductor region 412 and having a lower impurity concentration than the p-type semiconductor region 605.

In the manner described above, the second region 324 includes the p-type semiconductor region 619 between the p-type semiconductor region 605 and the electrode 404, enabling the p-type semiconductor region 619 to serve as a low-concentration electric field relief region. Accordingly, an electric field between the p-type semiconductor region 605 and the gate electrode can be relieved. This structure is called a lightly doped drain (LDD) structure. Thus, hot carrier amplification may be suppressed or reduced. In addition, reliability and ability to withstand voltage fluctuations may be improved.

In a case where a PMOS transistor having an LDD structure is used in a peripheral circuit region, an impurity ion implantation process to form the p-type semiconductor region 605 and the p-type semiconductor region 619 according to this example may be the same as an impurity ion implantation process to form the source and drain of the PMOS transistor in the peripheral circuit region.

In the case of pixels according to this example each having the structure described above, it is possible to form such pixels together with a peripheral circuit region without using any additional manufacturing process step in a process for manufacturing the pixels having the configuration according to this example.

The peripheral circuit region is a region in a surrounding portion of a region where a plurality of pixels are arranged on the semiconductor substrate 320. A control circuit that outputs the control signals pSEL, pRES, pTX, and pAPP described above is disposed in the peripheral circuit region. A circuit that samples a signal output through the signal line 211 illustrated in FIG. 2 from a plurality of pixels or that outputs a signal is also disposed in the peripheral circuit region. The same applies to the following examples.

In this example, the p-type semiconductor region 619 having a lower impurity concentration than the p-type semiconductor region 605 and having a higher impurity concentration than the p-type semiconductor region 412 is disposed between the p-type semiconductor region 605 and the electrode 404. As in the second example described above, an electric field between the electrode 404 and the p-type semiconductor region 605 can be relieved, and hot carrier amplification can be suppressed or reduced, resulting in a reduction in noise.

FOURTH EXAMPLE

Figure 9A:
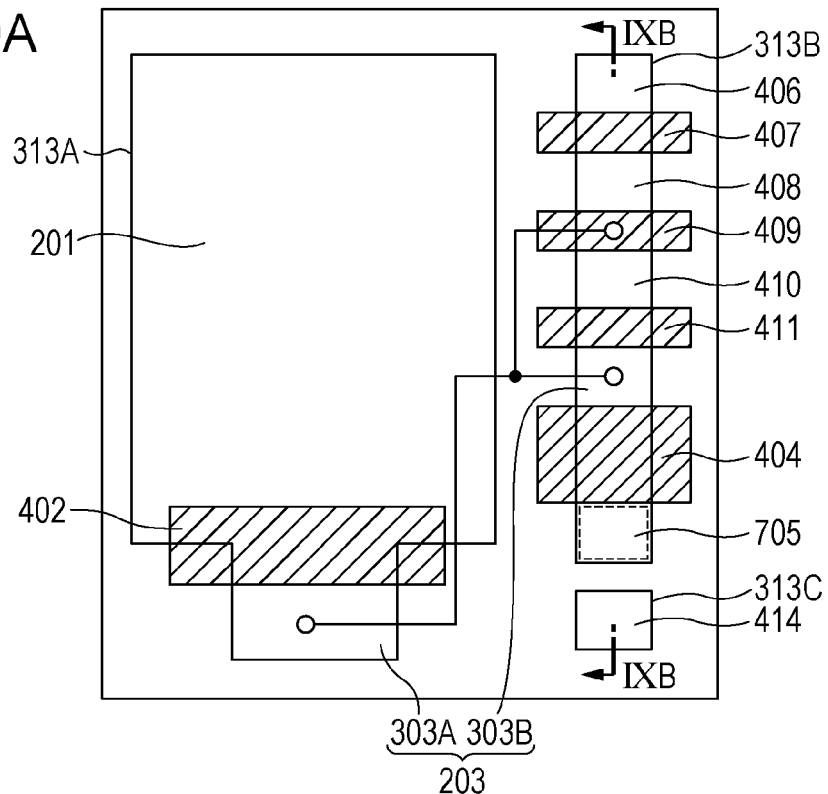
FIG. 9A is a schematic plan view of a pixel according to a fourth example.
Figure 9B:
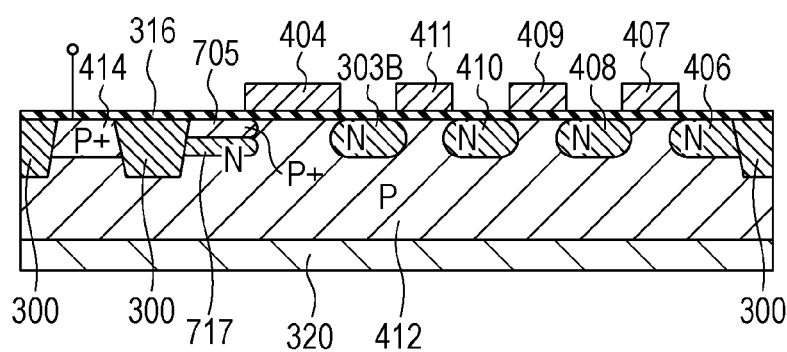
FIG. 9B is a schematic cross-sectional view of the pixel illustrated in FIG. 9A.

FIGS. 9A and 9B are a schematic plan view and a schematic cross-sectional view of each pixel of an imaging device according to this example, respectively, to illustrate the features of the pixel. Portions having functions similar to those in FIGS. 1 to 8B are assigned the same numerals, and are not described in detail.

FIG. 9A is a schematic plan view of each pixel of the imaging device according to this example. In this example, like the first example, the n-type semiconductor region 303B is disposed in the first region 323 and a p-type semiconductor region 705 having a higher impurity concentration than the p-type semiconductor region 412 is disposed in the second region 324 in plan view. Unlike the first example, however, an n-type semiconductor region 717 is disposed below the p-type semiconductor region 705. FIG. 9B is a schematic cross-sectional view taken along the line IXB-IXB in FIG. 9A.

In this example, as illustrated in FIG. 9B, the n-type semiconductor region 717, which forms an interface with the p-type semiconductor region 705, is disposed below the p-type semiconductor region 705. The n-type semiconductor region 717 is electrically connected to the surface-type MOS capacitor or buried-type MOS capacitor described above. A PN junction capacitor formed by the n-type semiconductor region 717 forms a portion of the capacitor 208.

The p-type semiconductor region 705 and the n-type semiconductor region 717 are formed in this order in the depth direction through the implantation of ions into the second region 324.

In this example, the p-type semiconductor region 705 in the second region 324 may not necessarily have a higher impurity concentration than the p-type semiconductor region 412. In a case where the p-type semiconductor region 705 does not have a higher impurity concentration than the p-type semiconductor region 412, the p-type semiconductor region 705 may be replaced with the p-type semiconductor region 412, which is a P-well.

FIFTH EXAMPLE

Figure 10A:
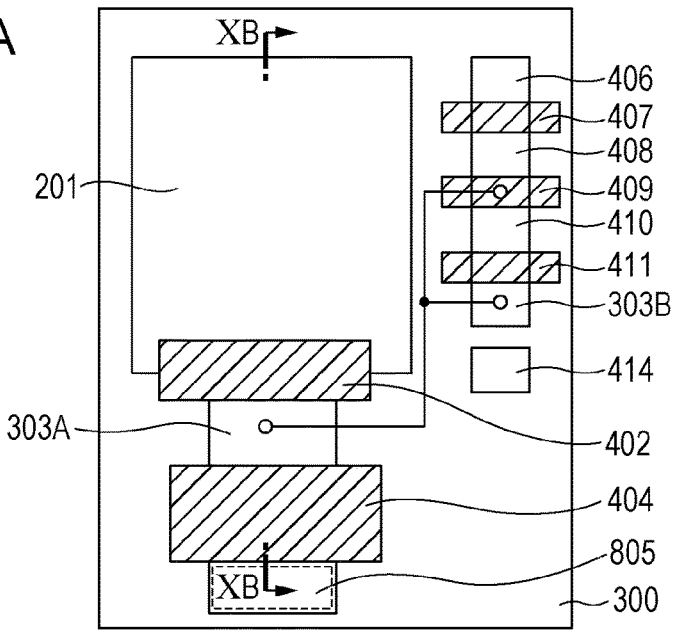
FIGS. 10A and 10C are schematic plan views of a pixel according to a fifth example.
Figure 10B:
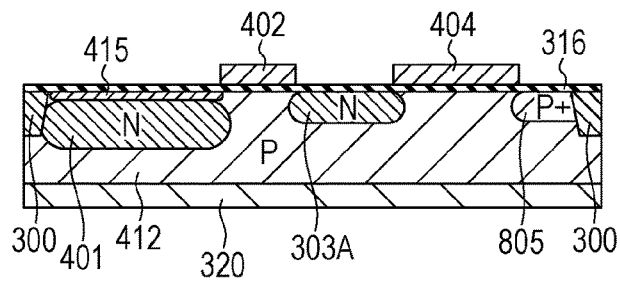
FIG. 10B is a schematic cross-sectional view of the pixel illustrated in FIG. 10A.
Figure 10C:
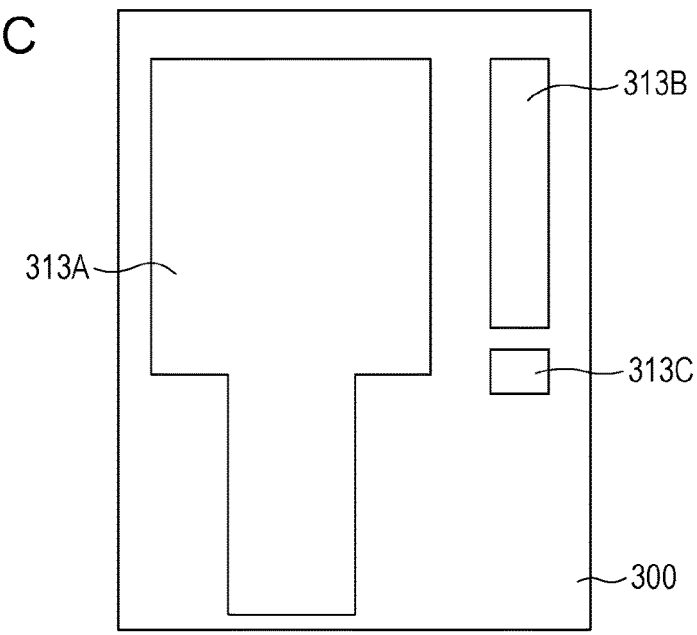

FIGS. 10A to 10C illustrate schematic plan views and a schematic cross-sectional view of each pixel of an imaging device according to this example to illustrate the features of the pixel. Portions having functions similar to those in FIGS. 1 to 9B are assigned the same numerals, and are not described in detail.

FIG. 10A is a schematic plan view of each pixel of the imaging device according to this example. FIG. 10B is a schematic cross-sectional view taken along the line XB-XB in FIG. 10A. As illustrated in FIG. 10C, in the active regions 313A to 313C according to this example, the first active region 313A has a different shape from the first active region 313A according to the first to fourth examples. Further, unlike the first example to the fourth example, the electrode 404 and the second region 324 are located in the first active region 313A. In this example, the n-type semiconductor region 303A and a p-type semiconductor region 805 are disposed in the first active region 313A so that the n-type semiconductor region 303A and the p-type semiconductor region 805 are arranged with the electrode 404 placed therebetween. The region where the n-type semiconductor region 303A is located corresponds to the first region 323, and the region where the p-type semiconductor region 805 is located corresponds to the second region 324.

In this example, the first active region 313A includes the photoelectric conversion unit 201, the n-type semiconductor region 303A, the electrode 404, and the p-type semiconductor region 805. The second active region 313B includes the n-type semiconductor region 406, the gate electrode 407, the n-type semiconductor region 408, the gate electrode 409, the n-type semiconductor region 410, the gate electrode 411, and the n-type semiconductor region 303B. The third active region 313C includes the p-type semiconductor region 414. A contact plug is connected to the p-type semiconductor region 414 to supply a potential to the p-type semiconductor region 412.

In this example, the FD 203 includes the n-type semiconductor region 303A and the n-type semiconductor region 303B.

While an embodiment of the present invention has been described with reference to some specific examples, the present invention is not limited to the embodiment described above, and a variety of changes and modifications can be made without departing from the spirit and scope of the present invention.

For example, a high-concentration semiconductor region called a channel stop region may be disposed at the interface between the insulator isolation portion 300 and an active region. The channel stop region is implemented as a p-type high-concentration semiconductor region in order to suppress the formation of a channel between n-type devices, and is implemented as an n-type high-concentration semiconductor region in order to suppress the formation of a channel between p-type devices. In the examples described above, the photoelectric conversion unit 201, the capacitor 208, and transistors of each pixel are n-type devices. Thus, a p-type semiconductor region is used as the channel stop region.

The channel stop region described above may be disposed in each of the examples described above. In this case, a p-type channel stop region may be disposed at the interface between the insulator isolation portion 300 and each of the p-type semiconductor region 312, the p-type semiconductor region 405, the p-type semiconductor region 412, the p-type semiconductor region 505, the p-type semiconductor region 605, the p-type semiconductor region 705, and the p-type semiconductor region 805. This configuration can reduce noise caused from the insulator isolation portion 300. The same applies to the other examples.

SIXTH EXAMPLE

Figure 11A:
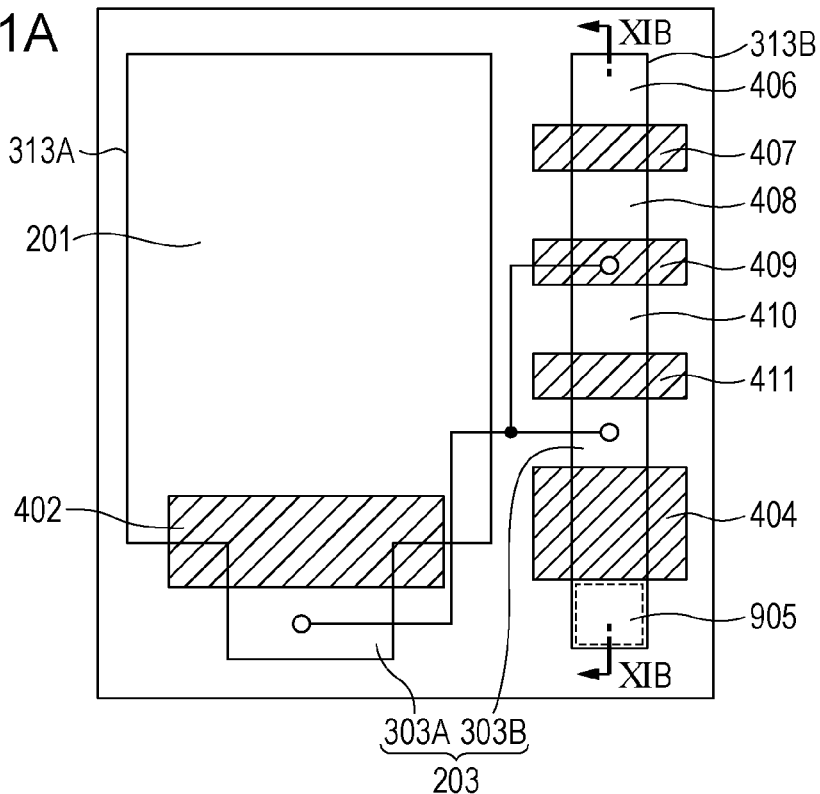
FIG. 11A is a schematic plan view of a pixel according to a sixth example.
Figure 11B:
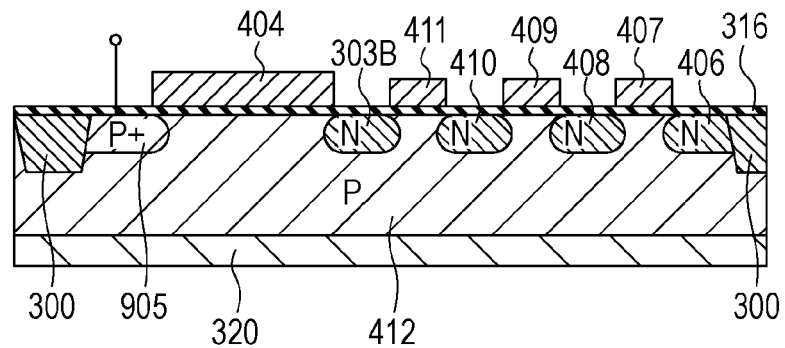
FIG. 11B is a schematic cross-sectional view of the pixel illustrated in FIG. 11A.
Figure 12:
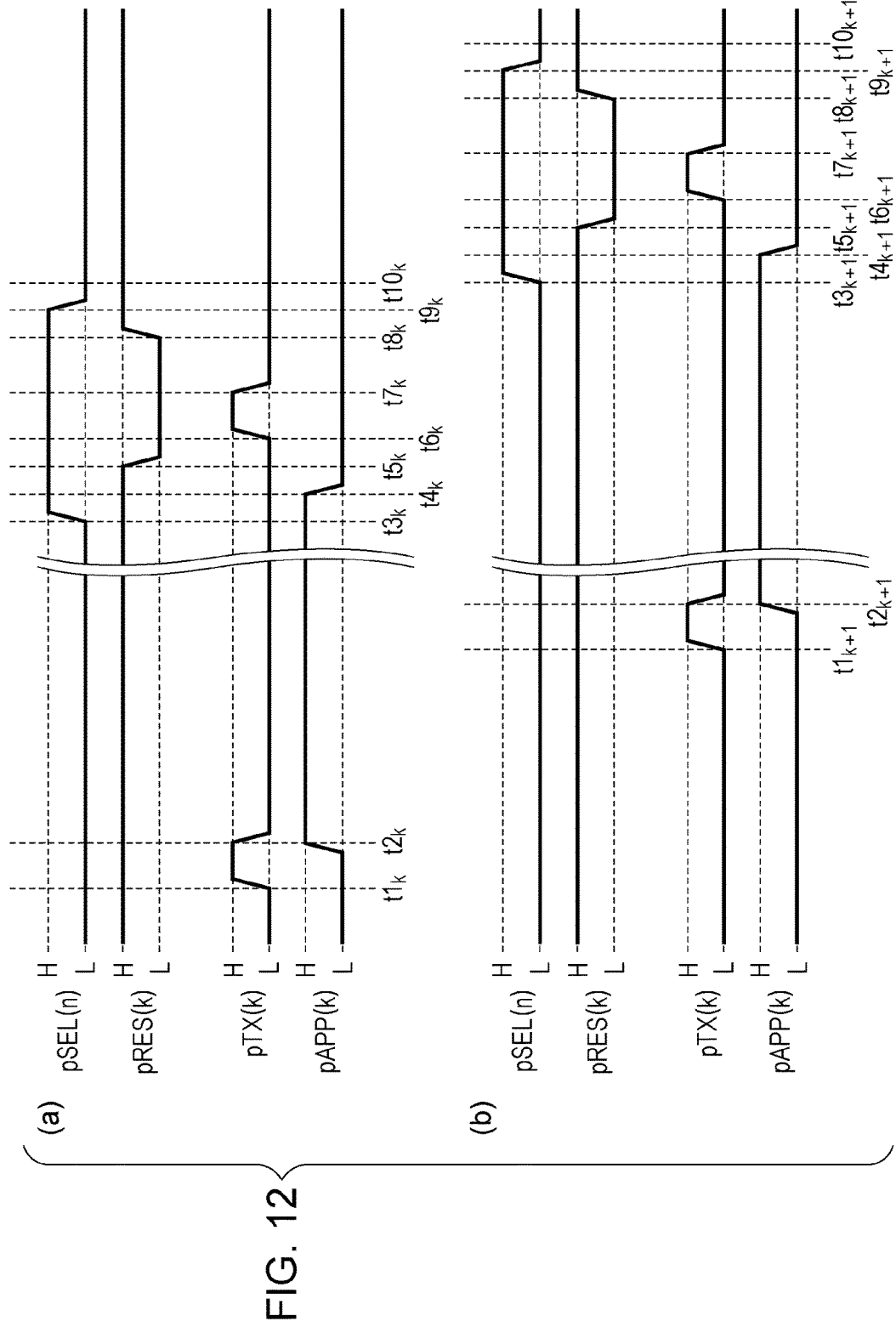
FIG. 12 is a driving timing diagram.

FIGS. 11A and 11B are a schematic plan view and a schematic cross-sectional view of each pixel of an imaging device according to this example, respectively, to illustrate the features of the pixel. FIG. 12 illustrates a driving timing diagram. Portions having functions similar to those in FIGS. 1 to 10C are assigned the same numerals, and are not described in detail.

FIG. 11A is a schematic plan view of each pixel. In this example, unlike the first to fifth examples, the third active region 313C is not disposed.

FIG. 11B is a schematic cross-sectional view taken along the line XIB-XIB in FIG. 11A.

In this example, a contact plug to which a reference potential is supplied extends through the insulating film 316 and is connected to a p-type semiconductor region 905. This configuration makes the p-type semiconductor region 414 for supplying a reference potential to the p-type well region 412 in the first to fifth examples and the p-type semiconductor regions (405, 505, 605, 705, and 805) in the second region 324 common into the p-type semiconductor region 905.

The configuration described above is applicable to any of the examples described above. Absence of the third active region 313C can reduce a planar layout area, leading to an increase in the area of the capacitor 208 or the photoelectric conversion unit 201 in plan view.

In this example, for example, increasing the area of the electrode 404 can increase the capacitance value of the capacitor 208. Thus, it is possible to increase the capacitance value of the input node of the amplifier transistor 205 when the capacitor 208 is electrically connected to the FD 203, and further expansion of the dynamic range is achieved.

In addition, an increase in the size of the photoelectric conversion unit 201 makes it possible to increase a saturation signal quantity. An increase in the size of the amplifier transistor 205 makes it possible to reduce 1/f noise and to increase image quality.

Driving Method According to Modification

A driving method according to a modification illustrated in FIG. 12 will now be described. In parts (a) and (b) of FIG. 12, an example of the driving timing of the pixels in the k-th row and the driving timing of the pixels in the (k+1)-th row while the capacitor 208 is in the unconnected state is illustrated. Unlike the driving timing diagram illustrated in FIG. 3, the period from time $t1_k$ to time $t2_k$ during which the charge in the photoelectric conversion unit 201 is reset is added in order to obtain a signal for a desired accumulation period.

In part (a) of FIG. 12, a signal is accumulated in the photoelectric conversion unit 201 during the period from time $t2_k$ to time $t6_k$. In this period, charge which causes noise may enter the photoelectric conversion unit 201. To suppress the entry of the charge, in this example, the control signal pAPP(k) is set to the high level in the period from time $t2_k$ to time $t4_k$ to reset the capacitor 208.

Through the driving control described above, if an electron which causes noise is generated in the p-type semiconductor region 905, the electron is directed toward the n-type semiconductor region 303B, which is located closer to the p-type semiconductor region 905 than the photoelectric conversion unit 201 is and which is reset to a high potential. This can prevent a dark current from flowing into the photoelectric conversion unit 201.

The control signal pAPP(k) may not necessarily be set to the low level at time $t4_k$ if a signal is read out while the capacitor 208 is brought into an operating state and the dynamic range is expanded by an increase in the capacitance value of the n-type semiconductor region 303B.

The driving method according to the modification described above is commonly applicable to any of the examples described above. In particular, the driving method according to the modification is applied to the sixth example for the following reason. In the sixth example, a contact plug is connected to the p-type semiconductor region 905, where an electron which causes noise may be generated. The application of the driving method according to the modification can further reduce noise.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-151123, filed Jul. 24, 2014, which is hereby incorporated by reference herein in its entirety.

What is claimed is:

1. An imaging device comprising:
    a plurality of pixels, each including
        a photoelectric conversion unit,
        a floating diffusion configured to hold charge generated in the photoelectric conversion unit,
        an amplifier transistor electrically connected to the floating diffusion, and
        a capacitor including an electrode, the capacitor being disposed so that electrical connection of the capacitor to the floating diffusion is switchable in accordance with a signal supplied to the electrode,
    wherein the electrical connection of the capacitor to the floating diffusion is switched to vary a capacitance value of an input node of the amplifier transistor,
    wherein each of the plurality of pixels has an active region including a first region and a second region, the first region and the second region being arranged with the electrode therebetween in plan view,
    wherein a portion that is a portion of the active region and that is located under the electrode forms at least a portion of the capacitor,
    wherein the first region includes a first semiconductor region of a first conductivity type, the first semiconductor region forming at least a portion of the floating diffusion,
    wherein the second region includes a second semiconductor region of a second conductivity type opposite to the first conductivity type, and
    wherein an insulating film is disposed on the second semiconductor region.

2. The imaging device according to claim 1, wherein the insulating film forms an interface with the second semiconductor region.

3. The imaging device according to claim 1, wherein the active region is defined by an insulator isolation portion, and
    wherein the second semiconductor region is located in at least a portion of the second region up to a depth equal to a depth of a bottom of the insulator isolation portion.

4. The imaging device according to claim 1, wherein a semiconductor region of the second conductivity type is disposed below the second semiconductor region, the semiconductor region having a lower concentration than the second semiconductor region.

5. The imaging device according to claim 3, wherein the insulator isolation portion forms an interface with a channel stop region.

6. The imaging device according to claim 1, wherein a contact plug extends through the insulating film and is connected to the second semiconductor region.

7. The imaging device according to claim 1, wherein a semiconductor region of a conductivity type that is identical to the conductivity type of the second semiconductor region is disposed between the second semiconductor region and the electrode in plan view, the semiconductor region having a lower concentration than the second semiconductor region.

8. The imaging device according to claim 1, wherein the active region includes a first active region where the photoelectric conversion unit and a third semiconductor region of the second conductivity type are located, and a second active region where the first semiconductor region and the second semiconductor region are located, and
    wherein the floating diffusion includes the first semiconductor region and the third semiconductor region.

9. The imaging device according to claim 8, wherein
each of the plurality of pixels further includes a transfer transistor configured to transfer a signal of the photoelectric conversion unit to the third semiconductor region,
wherein the first active region and the second active region are arranged side-by-side in a first direction in plan view,
wherein the first semiconductor region and the second semiconductor region are located in the second active region so as to be arranged in a second direction perpendicular to the first direction in plan view, and the electrode is disposed in the second active region so as to be located between the first semiconductor region and the second semiconductor region in plan view, and
wherein the photoelectric conversion unit and the third semiconductor region are located in the first active region so as to be arranged in the second direction in plan view, and a gate electrode of the transfer transistor is disposed in the first active region so as to be located between the photoelectric conversion unit and the third semiconductor region in plan view.

10. The imaging device according to claim 1, wherein the capacitor comprises a surface-type MOS capacitor or a buried-type MOS capacitor.

11. The imaging device according to claim 1, wherein the capacitor comprises a PN junction capacitor.

12. A method for driving the imaging device according to claim 1, comprising:
setting the capacitor to be in an electrically connected state in a period during which signal charge is accumulated in the photoelectric conversion unit and during which the input node is reset.

13. An imaging device comprising:
a plurality of pixels, each including
a photoelectric conversion unit,
a floating diffusion configured to hold charge generated in the photoelectric conversion unit,
an amplifier transistor electrically connected to the floating diffusion, and
a capacitor including an electrode, the capacitor being disposed so that electrical connection of the capacitor to the floating diffusion is switchable in accordance with a signal supplied to the electrode,
wherein each of the plurality of pixels has an active region including a first region and a second region, the first region and the second region being arranged with the electrode therebetween in plan view,
wherein the active region is defined by an insulator isolation portion,
wherein a portion that is a portion of the active region and that is located under the electrode forms the capacitor,
wherein the first region includes a first semiconductor region of a first conductivity type, the first semiconductor region forming at least a portion of the floating diffusion,
wherein the second region includes a semiconductor region of a second conductivity type opposite to the first conductivity type in the second region up to a depth equal to a depth of a bottom of the insulator isolation portion,
wherein a portion of the semiconductor region is disposed on a second semiconductor region, the second semiconductor region having a higher concentration than the other portion of the semiconductor region, and
wherein a contact plug is connected to the second semiconductor region.

\* \* \* \* \*